(12) United States Patent
Flax et al.

(10) Patent No.: US 9,153,956 B2
(45) Date of Patent: Oct. 6, 2015

(54) TEST DEVICE FOR POWER ENGINEERING EQUIPMENT AND METHOD FOR MANUFACTURING A TEST DEVICE FOR POWER ENGINEERING EQUIPMENT

(71) Applicant: OMICRON Electronics GmbH, Klaus (AT)

(72) Inventors: Dirk Flax, Dornbirn (AT); Horst Schedler, Nuziders (AT); Reinhard Kaufmann, Thuringerberg (AT)

(73) Assignee: OMICRON Electronics GmbH, Klaus (AT)

( * ) Notice: Subject to any disclaimer, the term of this patent is extended or adjusted under 35 U.S.C. 154(b) by 101 days.

(21) Appl. No.: 13/869,046

(22) Filed: Apr. 24, 2013

(65) Prior Publication Data

US 2013/0308238 A1    Nov. 21, 2013

(30) Foreign Application Priority Data

May 15, 2012  (EP) .................................... 12003837

(51) Int. Cl.
| | |
|---|---|
| *H02H 9/04* | (2006.01) |
| *H05K 13/00* | (2006.01) |
| *G01R 1/36* | (2006.01) |
| *G01R 35/00* | (2006.01) |

(52) U.S. Cl.
CPC .. *H02H 9/04* (2013.01); *G01R 1/36* (2013.01); *G01R 35/00* (2013.01); *H05K 13/00* (2013.01); *Y10T 29/49117* (2015.01)

(58) Field of Classification Search
CPC ............ G01R 1/36; G01R 35/00; H02H 9/04; H05K 13/00; Y10T 29/49117
USPC ......................................................... 361/91.5
See application file for complete search history.

(56) References Cited

U.S. PATENT DOCUMENTS

| | | | |
|---|---|---|---|
| 3,417,277 A | 12/1968 | Becker | |
| 3,914,657 A * | 10/1975 | Melanson | ..................... 361/117 |
| 5,479,315 A | 12/1995 | Schweitzer, III | |
| 6,445,196 B1 * | 9/2002 | White | ........................... 324/726 |
| 6,954,347 B1 * | 10/2005 | Chaudhry | ..................... 361/119 |
| 2011/0101989 A1 | 5/2011 | Hyde et al. | |

FOREIGN PATENT DOCUMENTS

| | | |
|---|---|---|
| CN | 1144411 A | 3/1997 |
| CN | 2313307 Y | 4/1999 |
| CN | 201523227 U | 7/2010 |
| CN | 201523337 U | 7/2010 |
| CN | 201699254 | 1/2011 |
| EP | 0035808 A1 | 9/1981 |

(Continued)

OTHER PUBLICATIONS

Chinese search document, 4 pages.

*Primary Examiner* — Thienvu Tran
*Assistant Examiner* — Kevin J Comber
(74) *Attorney, Agent, or Firm* — Seyfarth Shaw LLP; Brian L. Michaelis

(57) ABSTRACT

A test device (1) for testing power engineering equipment comprises at least one connection socket (4) which is electrically connected to an overvoltage protection arrangement (2). The overvoltage protection arrangement (2) comprises at least one overvoltage protection element (5) and is configured such that the at least one overvoltage protection element (5) is exchangeable.

12 Claims, 2 Drawing Sheets

(56) References Cited

FOREIGN PATENT DOCUMENTS

| | | | |
|---|---|---|---|
| EP | 0050966 | A1 | 5/1982 |
| EP | 0204675 | A2 | 12/1986 |
| JP | 1993-288775 | | 11/1993 |
| JP | 2000-083321 | | 3/2000 |
| JP | 2005-265484 | | 9/2005 |
| KR | 100856563 | B1 | 9/2008 |
| WO | 0074192 | A1 | 12/2000 |

* cited by examiner

TEST DEVICE FOR POWER ENGINEERING EQUIPMENT AND METHOD FOR MANUFACTURING A TEST DEVICE FOR POWER ENGINEERING EQUIPMENT

RELATED CASE INFORMATION

This application claims priority to EP Application No. 12003837.7, filed May 15, 2012 which is incorporated herein in its entirety.

FIELD OF THE INVENTION

The invention relates to a test device for power engineering equipment and a method for manufacturing a test device for power engineering equipment. In particular, the invention relates to a test device for testing and checking, respectively, operating resources in electrical high voltage and medium voltage systems, such as power transformers, current or voltage converters, circuit breakers, protection relays, generators, motors or cable systems etc., as well as a method of manufacturing such a test device.

BACKGROUND OF THE INVENTION

In test devices for testing operating resources in electrical high or medium voltage systems, overvoltages may often occur, which reach or are applied to the interior of the test device through the input sockets or output sockets of the test device and may damage or even destroy there components of the test device, in particular the electronics of the test device. Therefore, overvoltage protection elements such as suppressor diodes or overvoltage gas arrester are installed in conventional test devices in order to protect the test device against such overvoltages or surge voltages.

FIG. 1 schematically shows a test device 1 according to the state of the art. The test device 1 comprises a housing 9 with a plurality of sockets 4 or connection terminals 4, each socket 4 being provided for applying an input signal to be evaluated by the test device 1 or for outputting a test signal by the test device 1 via the respective socket. In the example shown in FIG. 1, for protecting the test device 1 against overvoltages, each of the sockets 4 is connected to a separate overvoltage protection element 3 that is fixed installed in the housing 9.

For example, each protection element 3 may be an overvoltage gas arrester. In the case of overvoltage gas arresters, a small arc ignites if a predetermined voltage is exceeded to discharge the overvoltage to earth. Such overvoltage gas arresters may also be equipped with short-circuit springs. In this case, a spacer melts if the arc occurs too long, and the short-circuit spring can then short-circuit the contacts of the overvoltage gas arrester. Thereby, the overvoltage is reduced to almost zero so that the electronics of the test device can be permanently protected against a malfunction or a fault.

Likewise, suppressor diodes such as TransZorb diodes may be used as protection elements, which have a voltage limiting effect but lead to an electric short-circuit if an overvoltage or overload occurs.

The conventional overvoltage protection arrangements have in common that, if an overvoltage occurs, the protection elements respectively used are destroyed similar to a fuse in order to protect the test device against the overvoltage. To restore or repair a test device in which such an overvoltage protection element has been destroyed by an overvoltage, the housing of the test device has to be opened and an extensive, time-consuming and costly repair has to be carried out.

Therefore, it is the object of the invention to provide a test device for power engineering equipment and a method for manufacturing a test device for power engineering equipment with this problem being resolved and it being possible to restore the test device in a simple and cost-effective way even after a damage or destruction of an overvoltage protection element.

SUMMARY OF THE INVENTION

According to the invention, a test device for power engineering equipment or power engineering devices and arrangements and a method for manufacturing such a test device are provided, wherein the test device comprises at least one socket or connection terminal for receiving an input signal or outputting an output signal, the at least one socket being electrically connected to an overvoltage protection arrangement. The overvoltage protection arrangement comprises at least one overvoltage protection element and is configured such that the at least one overvoltage protection element is exchangeable.

Thus, the overvoltage protection element can be replaced without great effort even after a damage or destruction of the overvoltage protection element, so that the test device can be restored by simple means and cost-effectively.

"Socket" in the sense of the present invention is to be understood as every connection device of the test device, via which an input signal to be supplied to the test device (such as a measurement signal to be evaluated by the test device) can be received or an output signal of the test device (in particular a test signal to be applied to a device under test) can be output. This connection device may thus also comprise a built-in plug connector or any other suitable electrical connection and connector.

The test device may in particular be designed as a test device for testing power engineering equipment or operating resources of electrical high voltage or medium voltage systems.

Preferably, the overvoltage protection arrangement of the test device is configured such that the exchange of the overvoltage protection element can be carried out like an exchange of a fuse without opening the housing of the test device and without tools. It at all, simplest means, like a screwdriver, may be necessary for exchanging the overvoltage protection element.

According to an illustrative embodiment, the at least one socket is connected to the at least one overvoltage protection element via a diode arrangement, the individual diodes letting current pass only in one direction and being connected such that an additional protection is ensured by the diode arrangement.

According to a further illustrative embodiment of the disclosure, the test device comprises a plurality of sockets with each socket being electrically connected to the same overvoltage protection element. Alternatively, each socket may be connected to a separate overvoltage protection element, all the overvoltage protection elements being provided in a common exchangeable module or in separate exchangeable modules. In case a separate overvoltage protection element is used for each socket, at least those sockets can still be used which are still protected by overvoltage protection elements that are functioning and in good order, even if another one of the overvoltage protection elements should be damaged or destroyed by an overvoltage.

The at least one overvoltage protection element preferably is a suppressor diode, such as a TransZorb diode, or an overvoltage arrester or overvoltage gas arrester, such as a gas discharge tube or any other type of a gas discharge device, the overvoltage gas arrester optionally being provided with a short-circuit spring.

BRIEF DESCRIPTION OF THE DRAWINGS

In the following, the invention will be further described in detail by means of a preferred embodiment with reference to the drawings.

DETAILED DESCRIPTION OF THE INVENTION

Figure 2:
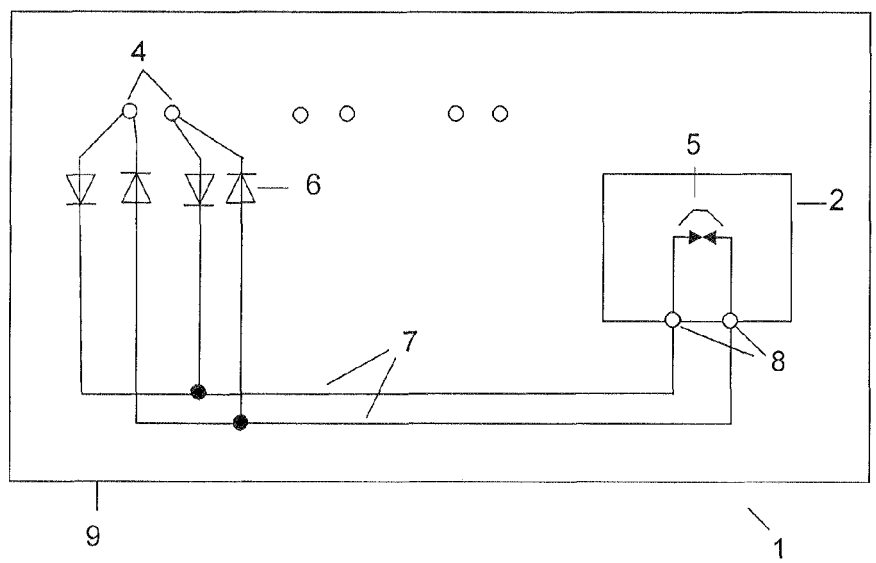
FIG. 2 shows schematically a test device for power engineering equipment according to an embodiment of the invention.

In the test device 1 shown in FIG. 2, at least one socket or connection terminal 4 is provided at a housing 9 of the test device. The socket 4 may be an input socket for receiving a corresponding input signal, so as to evaluate a measurement signal tapped at a device under test (not shown) and to check the functioning and the condition, respectively, of the device under test by the test device 1, for example. The device under test in particular may be an operating resource of a medium voltage or high voltage system, such as a power transformer, a current converter, a voltage converter, a circuit breaker, a protection relay, a generator, a motor, or a cable system etc. The socket 4 may also be an output socket of the test device 1 via which a test signal can be applied to the respective device under test, for example.

For protection against overvoltage, the socket 4 is electrically connected to an overvoltage protection arrangement 2 via connection lines 7. At least one overvoltage protection element 5 is provided within the overvoltage protection arrangement 2, which for example may be a suppressor diode, such as a TransZorb diode, or an overvoltage arrester, in particular an overvoltage gas arrester.

The overvoltage protection arrangement 2 is preferably arranged in the form of an exchangeable module in or at the test device 1, so that the overvoltage protection element 5 can be exchanged easily and preferably without tools by an exchange of the module if the overvoltage protection element 5 should be damaged or destroyed. For this purpose, the module of the overvoltage protection arrangement 2 may have electrical contacts 8 at suitable positions, which connect the respective overvoltage protection element 5 with the connection lines when inserting the module. In particular, the module may be provided with plug contacts 8, so that for exchanging the overvoltage protection element 5 the module can be easily pulled out from the housing 9 and replaced by a new module having a functioning overvoltage protection element 5, which thereafter is plugged into the housing 9 again. As a matter of course, it is also possible to change the overvoltage protection element 5 only after having removed the module and, thereafter, to insert the same module with the new overvoltage protection element in the housing 9 again.

The arrangement and configuration of the overvoltage protection arrangement 2 preferably is such that the overvoltage protection arrangement 2 and the overvoltage protection element 5, respectively, can be exchanged like a fuse without having to open the housing 9 of the test device 1. Thus, an extensive repair can be avoided, and the test device 1 can be put into operation again without expenditure of considerable time.

Figure 1:
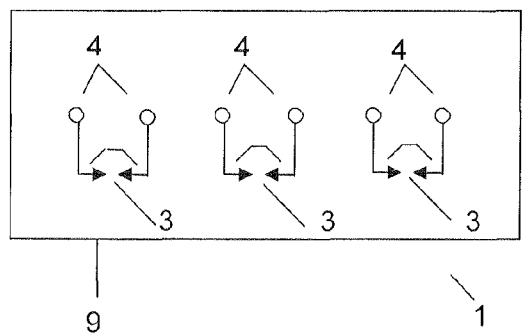
FIG. 1 shows schematically a test device according to the prior state of the art.

In the embodiment shown in FIG. 1, the socket 4 is not directly connected to the overvoltage protection arrangement 2 via the connection lines 7, but through a diode arrangement 5 in which the individual diodes are connected to the socket 4 and to the connection lines 7 in such a manner that an additional protection of the test device 1 is provided by the diodes.

As already described above, the overvoltage protection element 5 may be an overvoltage arrester, in particular an overvoltage gas arrester. In overvoltage gas arresters, a small arc ignites if a predetermined voltage is exceeded to discharge the overvoltage to earth. Such overvoltage gas arresters may also be equipped with short-circuit springs. In this case, a spacer melts if the arc occurs too long, and the short-circuit spring can then short-circuit the contacts of the overvoltage gas arrester. The overvoltage then becomes almost zero, so that the electronics of the test device is permanently protected against a malfunction or a fault.

A suppressor diode may be used as the overvoltage protection element 5 as well, the suppressor diode having a voltage limiting function, but effecting an electric short-circuit upon occurrence of an overvoltage or an overload.

Figure 3:
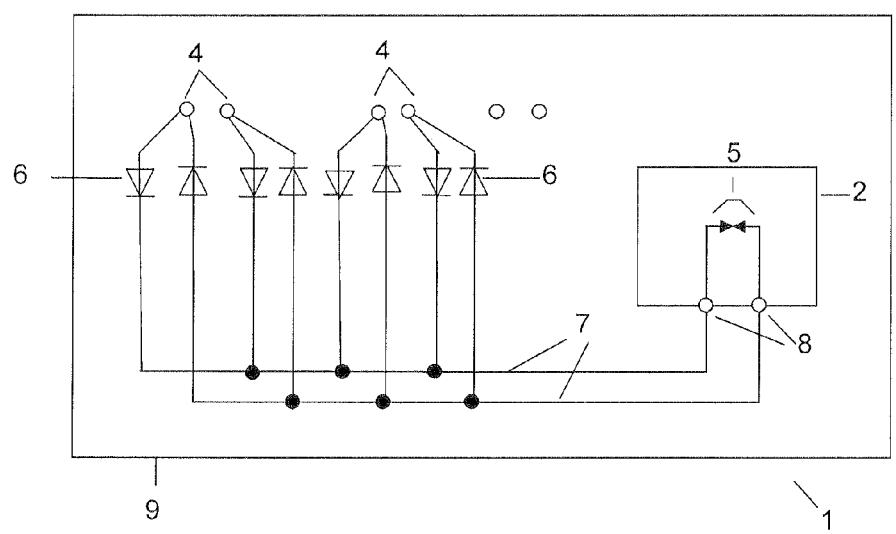
FIG. 3 shows schematically a test device for power engineering equipment according to a further embodiment of the invention.

FIG. 3 shows a further illustrative embodiment of the present invention.

The test device 1 shown in FIG. 3 comprises a plurality of sockets 4 which are each connected via diode arrangements 6 to one and the same overvoltage protection element 5 of an overvoltage protection arrangement 2. Apart from that, the embodiment shown in FIG. 3 corresponds to the embodiment of FIG. 2, so that reference can be made to the above explanations on FIG. 2 in their entirety.

Alternatively, each socket 4 may also be connected to an own overvoltage protection element 5 in a common overvoltage protection arrangement 2 or in separate exchangeable overvoltage protection arrangements.

Although the devices, systems, and methods have been described and illustrated in connection with certain embodiments, many variations and modifications will be evident to those skilled in the art and may be made without departing from the spirit and scope of the disclosure. The discourse is thus not to be limited to the precise details of methodology or construction set forth above as such variations and modifications are intended to be included within the scope of the disclosure.

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A test device for testing power engineering equipment, comprising:
    a housing,
    a plurality of sockets, each of the plurality of sockets comprising at least two terminals, and being provided for receiving a measurement signal to be evaluated or outputting a test signal, a common overvoltage protection arrangement comprising at least one common overvoltage protection element an being electrically connected to each of the plurality of sockets via a diode arrangement, and wherein the common overvoltage protection arrangement is configured such that the at least one common overvoltage protection element is exchangeable.

2. The test device according to claim 1,
wherein the test device is configured to be a test device for testing operating resources of an electrical high or medium voltage system.

3. The test device according to claim 1,
wherein the common overvoltage protection arrangement is configured such that the at least one common overvoltage protection element is exchangeable without having to open the housing.

4. The test device according to claim 1,
wherein the at least one common overvoltage protection element of the common overvoltage protection arrangement is a suppressor diode or an overvoltage gas arrester.

5. The test device according to claim 4,
wherein the overvoltage gas arrester comprises a short-circuit spring.

6. The test device according to claim 1,
wherein the common overvoltage protection arrangement is accommodated with the at least one common overvoltage protection element in a module which is arranged exchangeable in the housing.

7. A method for manufacturing a test device for testing power engineering equipment, comprising the steps:
providing a housing having a plurality of sockets, each of the plurality of sockets comprising at least two terminals, and being provided for receiving a measurement signal to be evaluated or for outputting a test signal,
arranging a common overvoltage protection arrangement with at least one common overvoltage protection element at or in the housing, and
electrically connecting each of the plurality of sockets to the at least one common overvoltage protection element of the common overvoltage protection arrangement via a diode arrangement,
wherein the common overvoltage protection arrangement is arranged at or in the housing such that the at least one common overvoltage protection element is exchangeable.

8. The method according to claim 7,
wherein the test device is configured to be a test device for testing operating resources of an electrical high or medium voltage system.

9. The method according to claim 7,
wherein said common overvoltage protection arrangement is configured such that the at least one common overvoltage protection element is exchangeable without having to open the housing.

10. The method according to claim 7,
wherein the at least one common overvoltage protection element of the common overvoltage protection arrangement is a suppressor diode or an overvoltage gas arrester.

11. The method according to claim 7,
wherein the at least one common overvoltage protection element of the common overvoltage protection arrangement is a suppressor diode or an overvoltage gas arrester, and said overvoltage gas arrester comprises a short-circuit spring.

12. The method according to claim 7,
wherein the common overvoltage protection arrangement is accommodated with the at least one common overvoltage protection element in a module which is arranged exchangeable in the housing.

* * * * *